United States Patent
Mieda et al.

(10) Patent No.: US 6,175,271 B1
(45) Date of Patent: Jan. 16, 2001

(54) OUTPUT SIGNAL CONVERTER FOR TUBE AMPLIFIERS

(75) Inventors: Fumio Mieda, Tokorozawa; Yasuhiko Mori, Toride; Hirofumi Mitoma, Kawasaki, all of (JP)

(73) Assignee: Korg Inc., Tokyo (JP)

(*) Notice: Under 35 U.S.C. 154(b), the term of this patent shall be extended for 0 days.

(21) Appl. No.: 09/200,102

(22) Filed: Nov. 24, 1998

(30) Foreign Application Priority Data

Dec. 4, 1997 (JP) ................................................ 9-348729
Jul. 14, 1998 (JP) ............................................... 10-199038

(51) Int. Cl.$^7$ .................................................. H03F 5/00
(52) U.S. Cl. ............................................. 330/3; 330/195
(58) Field of Search ................................... 330/3, 165, 195; 381/120

(56) References Cited

U.S. PATENT DOCUMENTS

| | | | |
|---|---|---|---|
| 4,439,742 | 3/1984 | Sondermeyer | 330/262 |
| 4,809,336 | 2/1989 | Pritchard | 381/61 |
| 4,937,874 | 6/1990 | Pittman et al. | 381/61 |
| 4,995,084 | 2/1991 | Pritchard | 379/94 |
| 5,032,796 | 7/1991 | Tiers et al. | 330/110 |
| 5,131,044 | 7/1992 | Brown, Sr. et al. | 381/61 |
| 5,133,014 | 7/1992 | Pritchard | 381/61 |
| 5,434,536 | 7/1995 | Pritchard | 327/599 |
| 5,524,055 | 6/1996 | Sondermeyer | 381/61 |
| 5,619,578 | 4/1997 | Sondermeyer et al. | 381/61 |
| 5,636,284 | 6/1997 | Prichard | 381/61 |
| 5,668,499 | 9/1997 | Albert et al. | 330/118 |
| 5,789,689 | 8/1998 | Doidic et al. | 84/603 |
| 5,805,713 | 9/1998 | Pritchard | 381/61 |
| 5,909,145 * | 6/1999 | Zimmerman | 381/120 X |

* cited by examiner

Primary Examiner—Steven J. Mottola
(74) Attorney, Agent, or Firm—Michael J. Striker

(57) ABSTRACT

The output signal converter for a tube amplifier includes semiconductor devices for amplifying or attenuating an output signal of the tube amplifier while maintaining output properties of the tube amplifier. The output signal converter in preferred embodiments has an output transformer (1) connected to the tube amplifier, a current amplifier and a voltage amplifier serially connected with each other via a node, and a speaker (4). The current amplification factor (Ac) of the current amplifier (2) and the voltage amplification factor (Av) of the voltage amplifier (3) are related according to the following equation: $Ac*Av=-k$, wherein $k$ is a constant.

3 Claims, 10 Drawing Sheets

OUTPUT SIGNAL CONVERTER FOR TUBE AMPLIFIERS

BACKGROUND OF THE INVENTION

The present invention is related to an amplifier for electronic musical instruments and audio systems, and more particularly to an output signal converter for tube amplifiers, which is installed on the rear side of a tube amplifier and which is capable of amplifying or attenuating output signals while advantageously maintaining the output properties of tube amplifiers.

Because of progress in the field of semiconductor technology, vacuum tube amplifiers for electronic musical instruments and audio systems have been replaced by amplifiers based on semiconductor devices, such as transistors. However, tube amplifiers have particular output properties which cannot be reproduced exactly by amplifiers using only semiconductor devices and thus have persistent popularity so that a small number of tube amplifiers are still being produced, sold and used.

The disadvantages of vacuum tubes are well known. They have comparatively short lives, are broken more easily, are less reliable, bigger and more inconvenient to install than corresponding semiconductor devices. They are comparatively heavy, produce more heat and are more expensive than similar semiconductor devices. In many cases amplifiers based on semiconductor devices must be used because the corresponding vacuum tube amplifier is not available.

Many types of amplifiers which mimic to some extent the output properties of tube amplifiers by using semiconductor devices have been devised and used in practice.

However, one output property that can be obtained by using tube amplifiers is the one obtainable under interactive relation when magnetic saturation in an output transformer installed on the backside of a tube amplifier and counter electromotive force generated in a speaker affect the performance of the tube amplifier. Therefore, in the prior art there is a limit to the ability of semiconductor devices to reproduce the output properties of tube amplifiers due to the interactive relation. In fact, no amplifiers which can accurately imitate the output properties of tube amplifiers are known in the prior art.

SUMMARY OF THE INVENTION

It is an object of the present invention to provide an output signal converter for tube amplifiers from which output signals of a predetermined power level can be obtained from those of a tube amplifier containing a minimum number of vacuum tubes by converting the output signals of the tube amplifier by means of semiconductor devices while maintaining tube amplifier output properties including transformer and speaker properties obtainable when using tube amplifiers.

According to one embodiment of the invention the output signal converter for a tube amplifier comprises semiconductor devices for amplifying or attenuating an output signal of the tube amplifier while maintaining output properties of the tube amplifier. The output signal converter comprises an output transformer connected to the tube amplifier and having two output terminals; a circuit branch consisting of a current amplifier and a voltage amplifier connected in series with each other via a node, wherein the circuit branch is connected across the output terminals of the output transformer, the current amplifier has a current amplification factor and the voltage amplifier has a voltage amplification factor; and a speaker including two input terminals, wherein one of the input terminals of the speaker is connected to the node between the current amplifier and the voltage amplifier while another of the input terminals of the speaker is connected to ground. Furthermore the current amplification factor of the current amplifier and the voltage amplification factor of the voltage amplifier are related according to the following equation: $Ac*Av=-k$, wherein k is a constant.

According to another embodiment of the invention the output signal converter for a tube amplifier comprises semiconductor devices for amplifying or attenuating an output signal of the tube amplifier while maintaining output properties of the tube amplifier. The output signal converter comprises an output transformer connected to the tube amplifier and having two output terminals; a loop circuit in which a voltage amplifier, a speaker and a current amplifier are connected in series with each other and with a node between the voltage amplifier and the current amplifier, wherein the node is connected to one of the output terminals of the output transformer, the current amplifier has a current amplification factor and the voltage amplifier has a voltage amplification factor; and wherein another of the output terminals of the output transformer is connected to ground and the current amplification factor of the current amplifier and the voltage amplification factor of the voltage amplifier are related by the following equation: $Ac*Av=-k$, wherein k is a constant.

According to a further embodiment of the invention the output signal converter for tube amplifier comprises semiconductor devices for amplifying or attenuating an output signal of the tube amplifier to be supplied to a speaker while maintaining output properties of the tube amplifier. The output signal converter comprises an output transformer connected to an output terminal of a tube amplifier and including two output terminals; a first voltage amplifier connected between the output terminals of the output transformer and having an infinite amplification factor; a first impedance circuit; a second voltage amplifier having an infinite amplification factor; a series connecting circuit with a coefficient multiplier; and a second impedance circuit connected in parallel with the first voltage amplifier; and wherein the speaker is connected in parallel to the second voltage amplifier.

The above-described embodiments of the output signal converters according to the invention for a tube amplifier comprise semiconductor devices and amplify or attenuate the output of a tube amplifier containing a minimum number, preferably one, vacuum tube while maintaining tube amplifier output characteristics. In this way the disadvantages of a tube amplifier containing a large number of vacuum tubes, that have comparative short lifetimes, are easily broken and inconvenient to install are avoided, while still maintaining the desirable output characteristics of a vacuum tube amplifier.

BRIEF DESCRIPTION OF THE DRAWINGS

The objects, features and advantages of the invention will now be illustrated in more detail with the aid of the following description of the preferred embodiments, with reference to the following accompanying figures.

FIGS. 4A, 4B, 4C and 4D are respective graphical illustrations showing output properties obtained when using the output signal converter according to the present invention, wherein FIG. 4A shows a sine wave to be input to the output signal converter, FIG. 4B shows a wave form of an output signal when the sine wave signal is input into an amplifier containing only semiconductor devices, FIG. 4C shows a wave form of an output signal when the sine wave is input into a tube amplifier, and FIG. 4D shows a wave form of an output signal when the sine wave is input into the converter circuit shown in FIG. 2.

FIGS. 6A, 6B and 6C are respective graphical illustrations showing output properties obtained when using the circuit shown in FIG. 5, wherein FIG. 6A shows a sine wave to be input, FIG. 6B shows a wave form of an output signal when the sine wave is input into a push-pull amplifier containing four vacuum tubes, and FIG. 6C shows a wave form of an output signal when the sine wave is input into the circuit shown in FIG. 5.

DETAILED DESCRIPTION OF THE PREFERRED EMBODIMENTS

Figure 1:
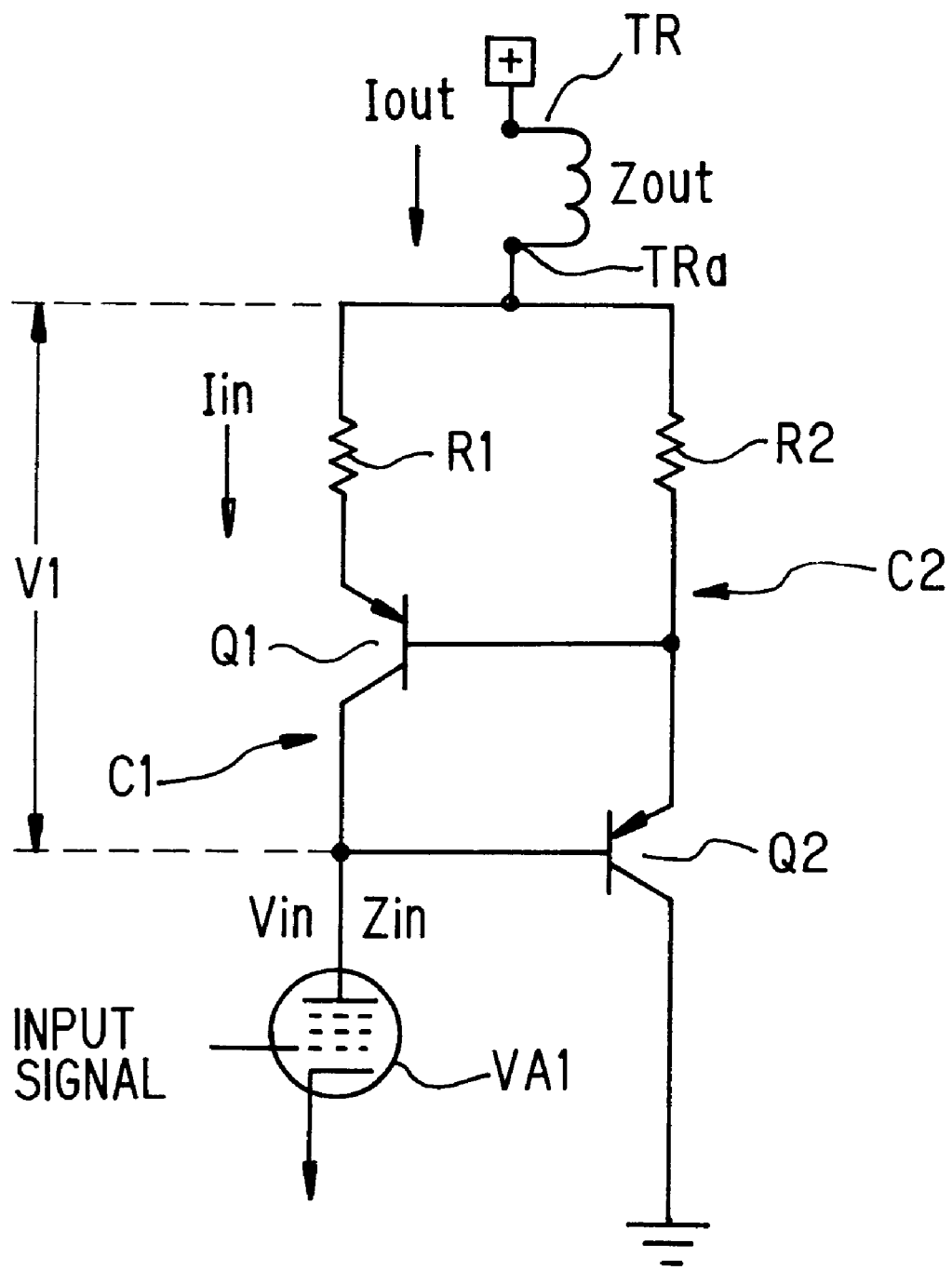
FIG. 1 is a circuit diagram showing an output signal converter for tube amplifiers according to a first embodiment of the present invention.

FIG. 1 is a circuit diagram showing an output signal converter for tube amplifiers according to the first embodiment of the present invention. With this output signal converter, it is possible to amplify output signals obtained from one vacuum tube VA1 while maintaining its output properties and thus obtaining output signals as if they are those obtained by using a plurality of vacuum tubes.

As shown in FIG. 1, the output signal converter is connected between a plate terminal of a vacuum tube VA1 and one of the input terminals TRa of an output transformer TR and comprises a first circuit branch C1 which is formed by a first resistance R1 and a first transistor Q1 connected in series and a second circuit branch C2 which is formed by a second resistance R2 and a second transistor Q2 connected in series.

Namely, the terminal TRa is branched into two systems, and in one of the systems (the first circuit branch C1) it is connected to an emitter of the first transistor Q1 via the first resistance R1, and a collector of the transistor Q1 is connected to the plate terminal of the vacuum tube VA1. In the other system (the second circuit branch C2) it is connected to an emitter of the second transistor Q2 via the second resistance R2, and a collector of the second transistor Q2 is connected to the ground. Further, a base of the first transistor Q1 is connected to the emitter of the second transistor Q2, and a base of the second transistor Q2 is connected to the plate terminal of the vacuum tube VA1.

Now, detailed performance of the output signal converter as constituted above is explained below. Current flowing into the primary side of the transformer TR is defined as Iout, current flowing into the first circuit branch C1 is defined as Iin, voltage between the plate terminal of the vacuum tube VA1 and the input terminal TRa of the transformer TR is defined as V1, an impedance of the load side at the transformer TR is defined as Zout, and an impedance of the load side at the vacuum tube VA1 is defined as Zin. The following equations (1) to (3) can be given:

$$Iout = Vin/(Zout + R1//R2) \tag{1},$$

wherein R1//R2 represents the parallel resistance of the resistance R1 and the resistance R2 connected in parallel, (R1*R2/R1+R2).

$$V1 = R1//R2 * Iout \tag{2}$$

$$Iin = V1/R1 \tag{3}$$

Equation (4) is obtained from equations (2) and (3):

$$Iin = [(R1//R2)/R1] * Iout \tag{4}$$

Further, an equation, Iin=Vin/Zin, is substituted into an equation (4), and an equation (1) is also substituted into the equation (4), thereby the following equation (5) can be given:

$$Vin/Zin = [(R1//R2)/R1] * Vin/[Zout+(R1//R2)] \tag{5}$$

By rearranging the equation (5) and developing R1//R2, the following equation (6) can be given:

$$Zin = [(R1+R2)/R2] * [Zout + \{(R1*R2)/(R1+R2)\}] \tag{6}$$

In the equation (6), under conditions such that R1<<Zout and R2<<Zout, the following equation (7) can be given:

$$Zin \approx [(R1+R2)/R2] * Zout \tag{7}$$

From the equation (7), it will be understood that Zin and Zout are determined according to a ratio of the first resistance R1 and the second resistance R2. For example, when R1=R2 is given, an equation, Zout=(½)Zin results, and the impedance becomes ½. Therefore, the current output of the transformer TR is doubled, which shows that output signals produced by the vacuum tube VA1 can be amplified to double the current output level. In addition, current flowing into the second circuit branch C2, which is a circuit branch formed with the second resistance R2 and the second transistor Q2, is equal to the current flowing into the first circuit branch C1 so that Iout is twice the value of Iin, which apparently maintains the output properties of the vacuum tube VA1. As a result, output signals having properties that are characteristic of two vacuum tubes, instead of only one vacuum tube, are obtained.

Also, by appropriately changing a ratio of the first resistance R1 and the second resistance R2, it is possible to change the current amplification factor. For example, if R2=2*R1 is given, it is possible to triple the value of Iout relative to the value of Iin, and if R2=(½)*R1 is given, it is possible to make a value of Iout to a 1.5 times value of Iin.

As described above, according to the output signal converter shown in FIG. 1, it is possible to obtain output signals having properties characteristic of more than 1 vacuum tube, by using just one vacuum tube VA1, and therefore, it becomes feasible to reduce the number of vacuum tubes to be provided to a minimum number. It is very advantageous to use the output signal converter according to the present invention for amplifiers in use for guitars and audio systems.

Although a resistance R2 of fixed value is used in the converter of FIG. 1, when a variable resistance R2 is given, it is possible to adjust the current value, Iout, by controlling the resistance value of the variable resistance to thereby allow control of output sound volume. Although sound volume control is normally provided at the input side, namely at the stage prior to the vacuum tube VA1 in FIG.1, it is possible to adjust the sound volume while keeping the current Iin flowing in the vacuum tube VA1 at a substantially fixed level by controlling the resistance value of the second resistance R2, which controls the sound volume while maintaining the output properties of vacuum tubes.

Figure 2:
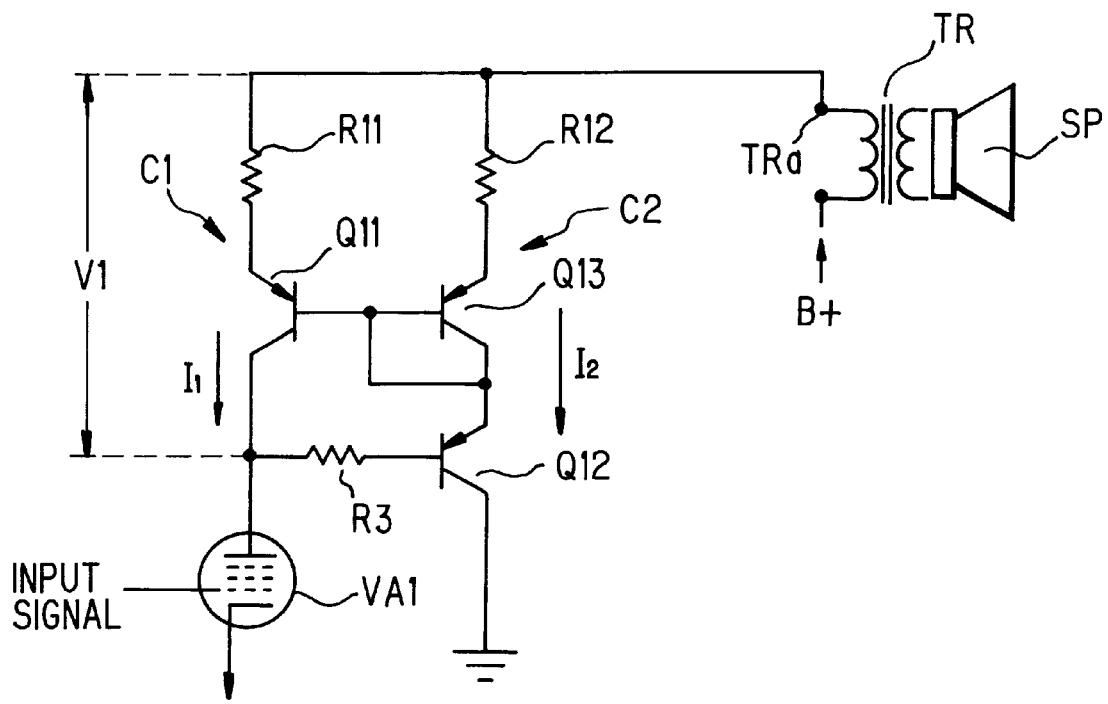
FIG. 2 is a circuit diagram showing the output signal converter for tube amplifiers according to a second embodiment of the present invention.

FIG. 2 is a circuit diagram showing the output signal converter for tube amplifiers according to the second embodiment of the present invention. As shown in FIG. 2, the output signal converter comprises an output transformer TR, resistances R11, R12 and R3, and transistors Q11, Q12 and Q13. A connecting cable connected to one of the input terminals of the output transformer TR is branched into two systems, and one of the branches (a first circuit branch C1) is connected to a plate terminal of a vacuum tube VA1 via the first resistance R11 and an emitter and a collector of the first transistor Q11, while the other branch (a second circuit branch C2) is connected to ground via the second resistance R12, an emitter and a collector of the third transistor Q13, and further an emitter and a collector of the second transistor Q12. Further, a base of the first transistor Q11 and a base of the third transistor Q13 are connected at a node, and this node is further connected to a collector of the second transistor Q12. Therefore, a current mirror circuit is formed with the first transistor Q11 and the third transistor Q13. Whereas, a base of the second transistor Q12 is connected to the plate terminal of the vacuum tube VA1 via the resistance R3, and a speaker SP is connected to the output side of the output transformer TR.

In the embodiment shown in FIG. 2, because of the current mirror circuit formed with the first transistor Q11 and the third transistor Q13, current directly imitating the property of the first transistor Q11, such as temperature characteristic, flows into the second circuit branch. It is possible to obtain output signals having the output properties of the vacuum tube VA1.

Figure 3:
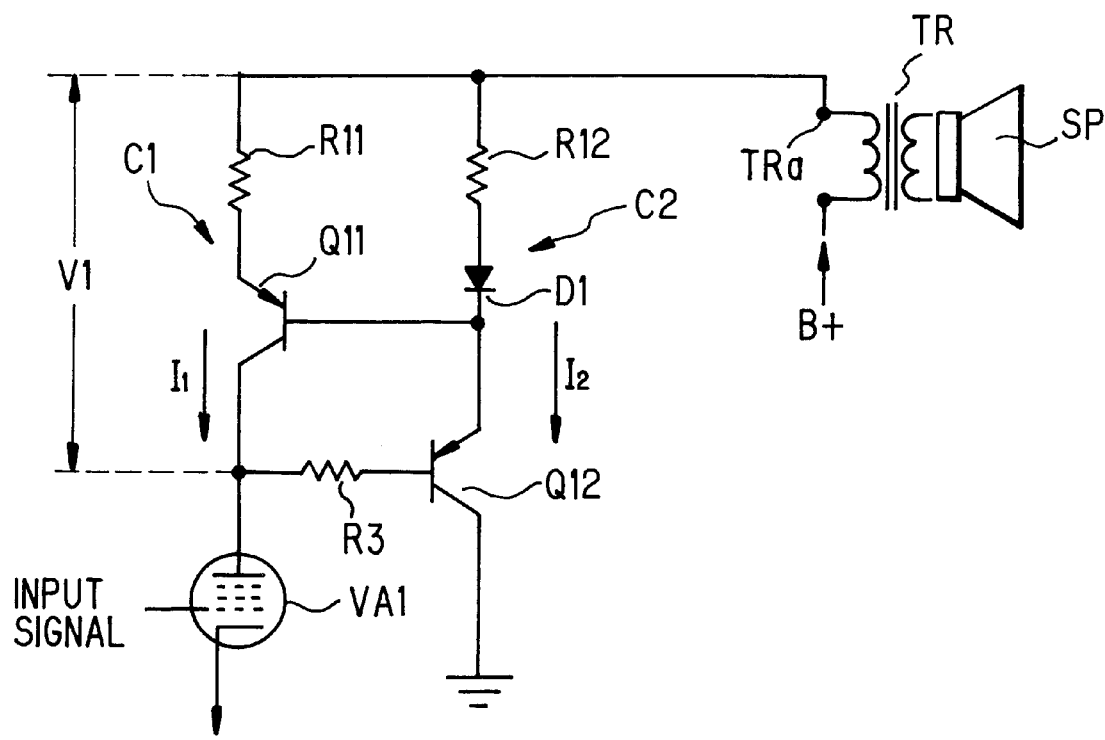
FIG. 3 is a circuit diagram showing the output signal converter for tube amplifiers according to a third embodiment of the present invention.

FIG. 3 is a circuit diagram showing the output signal converter according to third embodiment of the present invention. As shown in FIG. 3, a diode D1 is used as the substitute for the third transistor Q13 in the output signal circuit shown in FIG. 2. According to this type of structure, although performance stability gets worse in comparison with that in the output signal converting circuit as shown in FIG. 2, the circuit is simplified up to an extent that is obtainable by using a diode as a substitute of a transistor.

Figure 4A:
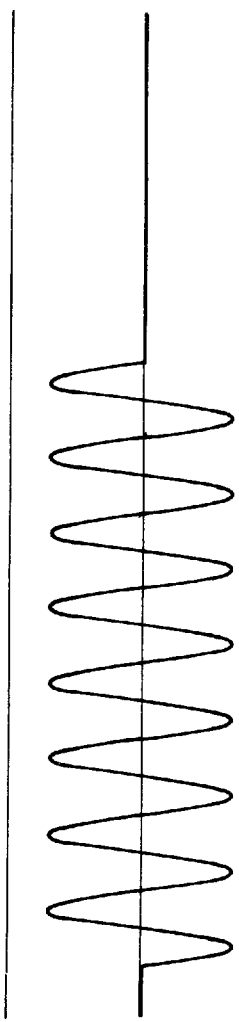
Figure 4B:
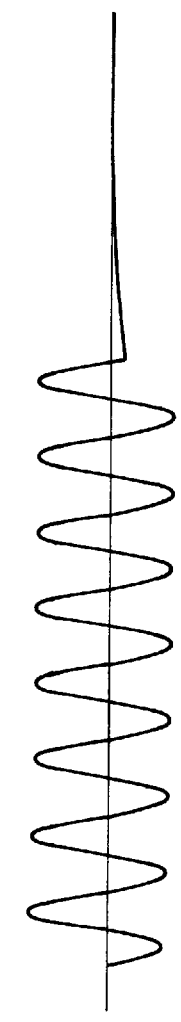
Figure 4C:
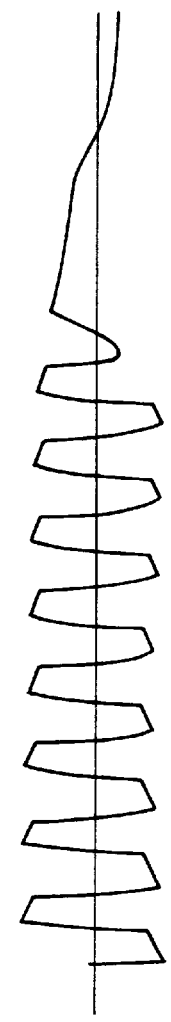
Figure 4D:
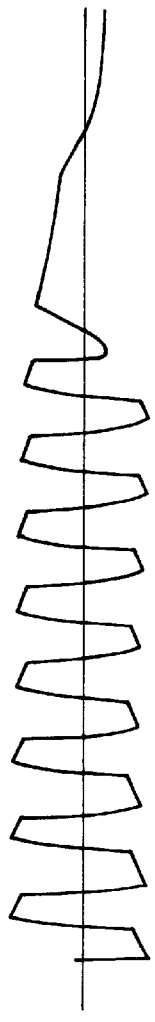

FIG. 4A shows a sine wave used as an input signal, FIG. 4B shows an output wave form obtained when the sine wave signal shown in FIG. 4A is amplified by using an amplifier constituted with semiconductor devices, FIG. 4C shows an output wave form obtained when the sine wave shown in FIG. 4A is amplified by using a conventional tube amplifier (an amplifier constituted with a plurality of vacuum tubes), and FIG. 4D shows an output wave form obtained when the sine wave signal shown in FIG. 4A is amplified by using the output signal converting circuit shown in FIG. 2. As easily understood from FIG. 4B, in contrast to the output wave form which substantially represents the input sine wave obtainable by using the amplifier containing semiconductor devices, the output wave form specifically produced by the tube amplifier is obtainable when using the conventional tube amplifier as shown in FIG. 4C.

When amplifying the sine wave shown in FIG. 4A by using the output signal converter shown in FIG. 2, it is possible to obtain output signals which are substantially equivalent to the output wave form obtainable by using a conventional tube amplifier as shown in FIG. 4D. Thus it will be understood that the output signal converter of the present invention is truly reproducing the output properties of the vacuum tubes in the conventional tube amplifier.

Figure 5:
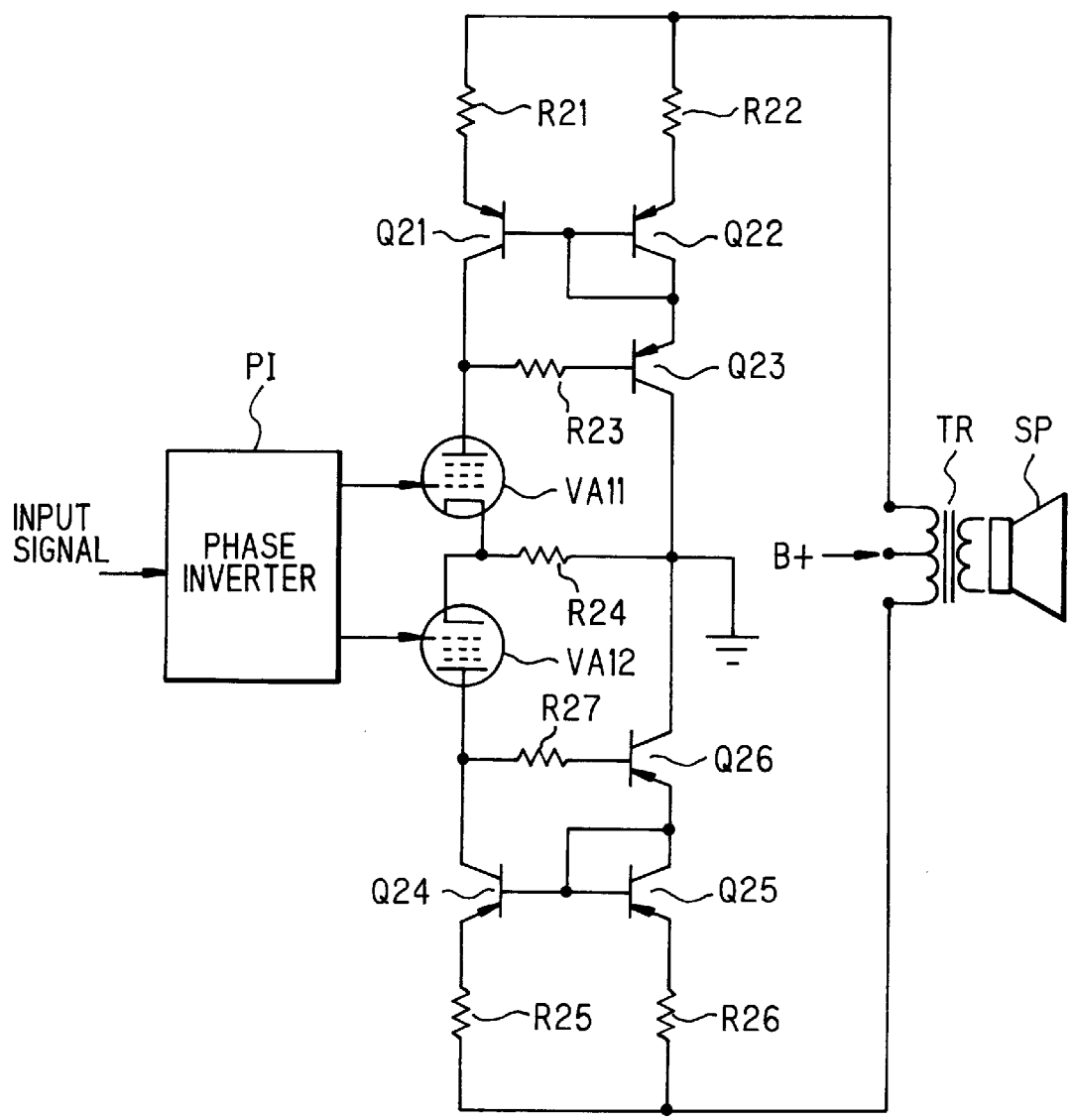
FIG. 5 is a circuit diagram showing the output signal converter for tube amplifiers according to a fourth embodiment of the present invention, and it is designed as a push-pull amplifier.

FIG. 5 is a circuit diagram showing the output signal converter according to the forth embodiment. As shown in FIG. 5, this push-pull amplifier comprises two vacuum tubes VA11 and VA12 in the output signal converter. Briefly, two circuit portions each using a current mirror of each other as shown in FIG. 2 are provided symmetrically in both upper and lower portions. The respective cathodes of the two vacuum tubes VA11 and VA12 are connected at a node, which, in turn, is connected to ground via resistance R24.

As is well known, push-pull type power amplification is an output system which separates sound signals produced by a preamplifier into positive and negative signals by using a phase inverter PI, amplifying the positive side signals in an upper circuit portion (i.e. a circuit containing Q21, Q22, Q23, etc.) provided with the vacuum tube VA11, amplifying the negative side signals in a lower circuit portion (i.e. a circuit containing Q24, Q25, Q26, etc.) provided with vacuum tube VA12, and forming signals at the output transformer TR and outputting them through the speaker SP. With the structure as described above, since two vacuum tubes VA11 and VA12 are used therein, it is possible to obtain output properties equivalent to those obtainable by a push-pull type tube amplifier containing many vacuum tubes.

Figure 6A:
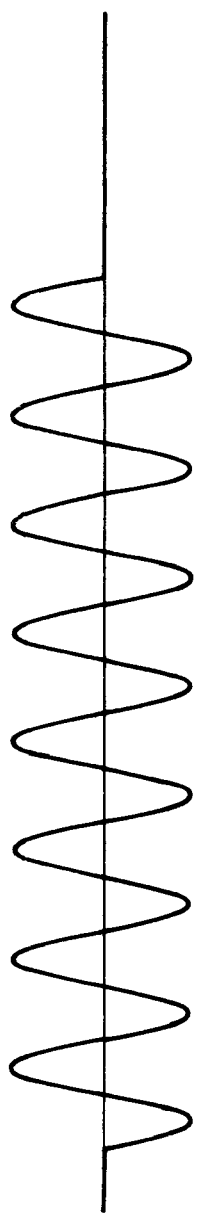
Figure 6B:
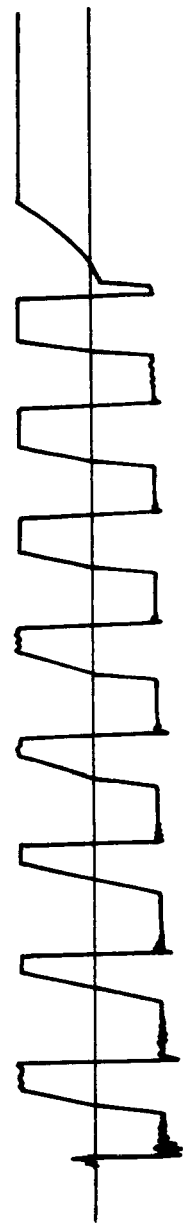
Figure 6C:
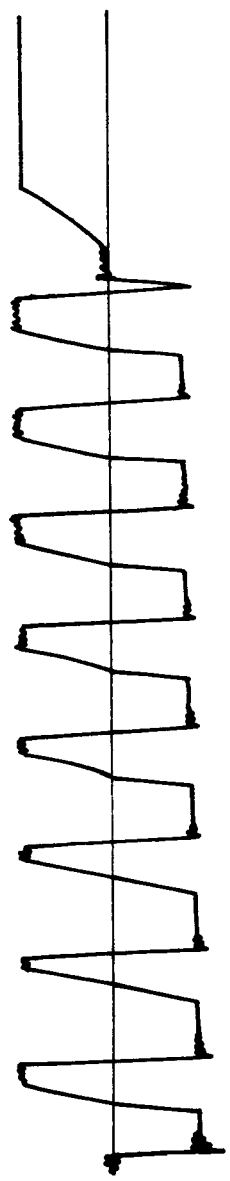

FIGS. 6A to 6C show respective wave forms having the output properties of the push-pull type amplifier shown in FIG. 5. FIG. 6A shows a sine wave as an input signal for the push-pull amplifier. FIG. 6B shows an output wave form when the sine wave shown in FIG. 6A is input into an amplifier constituted with four vacuum tubes, namely a conventional push-pull type tube amplifier, and FIG. 6C shows an output wave form when the sine wave shown in FIG. 6A is input into the amplifier shown in FIG. 5. As easily understood from FIGS. 6B and 6C, the output signal converter shown in FIG. 5 can truly reproduce the output properties produced by a vacuum tube, because the figures show that substantially equivalent wave forms are obtainable from a conventional push-pull type amplifier containing many vacuum tubes and an amplifier containing a minimum number of vacuum tubes in FIG. 5.

Figure 7:
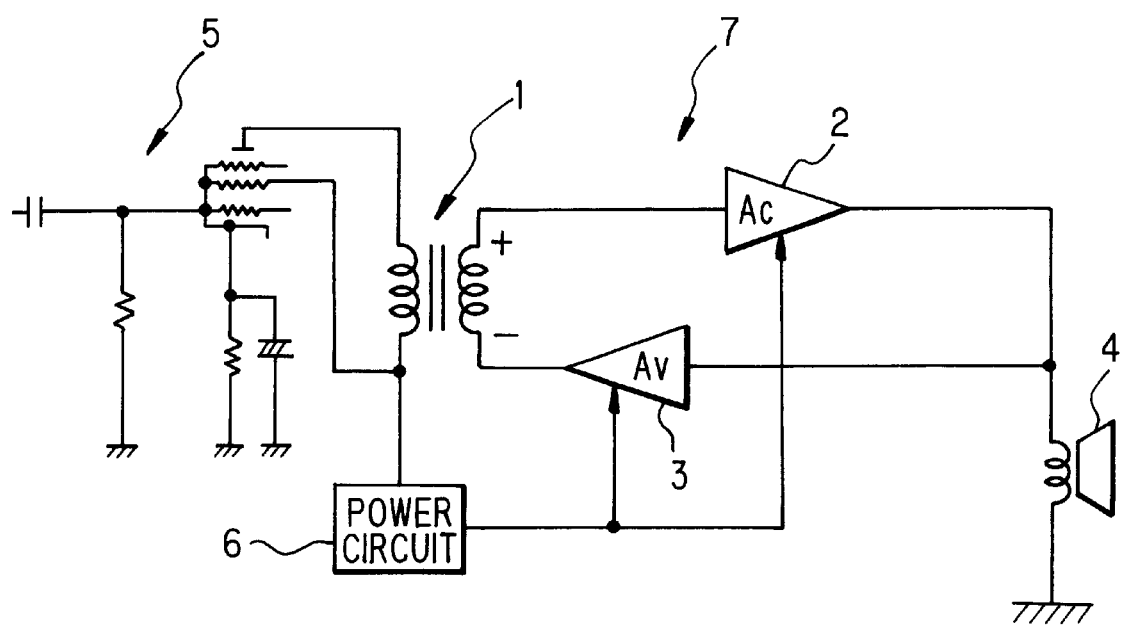
FIG. 7 is a circuit diagram showing the output signal converter for tube amplifiers according to a fifth embodiment of the present invention.

FIG. 7 is a circuit diagram showing the output signal converter according to the fifth embodiment. As shown in FIG. 7, an output signal converter 7 is installed at the output side of a tube amplifier 5 containing just one vacuum tube, which amplifies and/or attenuates output signals while maintaining the output properties of the tube amplifier 5.

The output signal converter 7 comprises a transformer 1 provided at the output side of the tube amplifier 5, a current amplifier 2 connected to a positive terminal at a secondary side of the transformer 1, and a voltage amplifier 3 connected to the output side of the current amplifier 2. The output terminal of the voltage amplifier 3 is connected to a negative terminal at the secondary side of the transformer 1. Further, a power circuit 6 is provided as an electric power supply for driving the tube amplifier 5 and the output signal converter 7. A speaker 4 is connected to the rear side of the output signal converter 7. One of the terminals of the speaker 4 is connected to a node between the current amplifier 2 and the voltage amplifier 3, while the other terminal is connected to the ground.

In the output signal converter shown in FIG. 7, there is a relationship between the current amplification factor Ac of the current amplifier 2 and voltage amplification factor Av of the voltage amplifier 3 in accordance with an equation, Ac*Av=−1. Therefore, an impedance of the load side viewed from the tube amplifier 5 becomes equivalent to an impedance of the load side (i.e. the side of the speaker 4) viewed from the output signal converter 7, as if the tube amplifier 5 is directly connected to the speaker 4.

Consequently, the output signal converter 7 can amplify or attenuate the level of the output signals to a desired level while maintaining the output properties of the tube amplifier 5. Specifically, since the output power is proportional to the square of the current amplification factor Ac at the current amplifier 2, if the conditions, Ac=−3.16 and Av=0.316 are given, the output power is the square of −3.16, that is 10, and therefore, a factor of 10 increase in power can be obtained in this case. Or, contrary to this, when taking the value of current amplification factor closer to zero, it possible to attenuate the maximum output while maintaining the output properties of the tube amplifier 5. The purpose of attenuation of the maximum output will be explained later hereinbelow.

Although the equation, Ac*Av=−1, is given in the explanation described above wherein just one speaker 4 is provided, it is also possible to provide the above-described relationship according to another equation, Ac*Av=−2 when two speakers 4 are connected in parallel, or according to the following equation, Ac*Av=−½, when two speakers 4 are connected in series. Therefore, when describing in general, an equation, Ac*Av=−k (k is a constant) can be set up to describe the general relationship.

Figure 8:
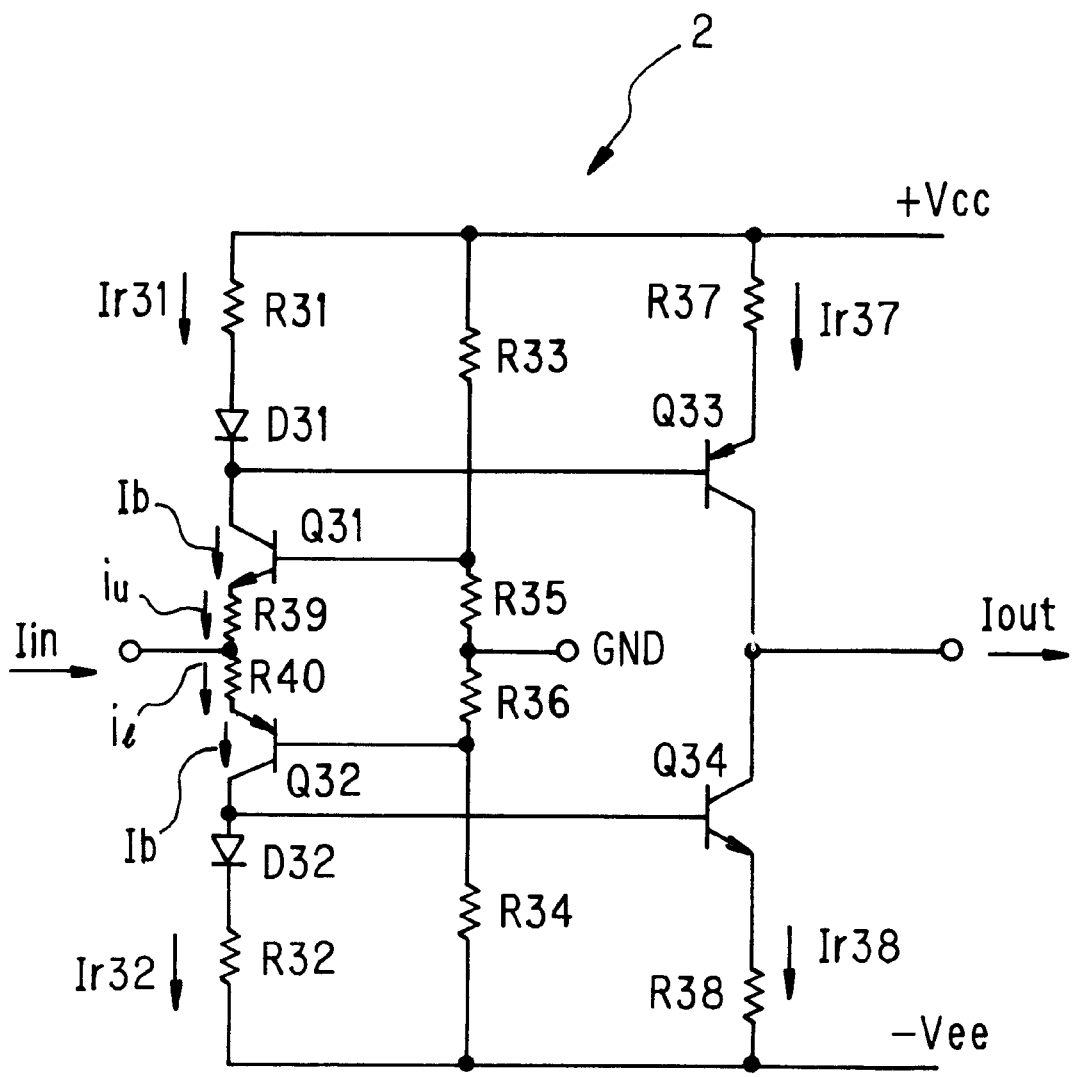
FIG. 8 is a circuit diagram showing a particular embodiment of a current amplifier for the output signal converter according to the invention.

FIG. 8 is a circuit diagram showing a concrete embodiment of the current amplifier 2 shown in FIG. 7. As shown in FIG. 8, the current amplifier 2 is constituted with four transistors Q31–Q34, a diode, a resistance, etc. and is arranged on a site between a power source +Vcc and a power source −Vee.

At the current input side, an emitter of the transistor Q31 (NPN-type) and an emitter of the transistor Q32 (PNP-type) are connected via resistances R39 and R40, and a collector of the transistor Q31 is connected to the power source +Vcc via a diode D31 and a resistance R31. Also, a collector of the transistor Q32 is connected to the power source −Vee via a diode D32 and a resistance R32. Whereas, between the power source +Vcc and the power source −Vee, a connecting circuit portion, in which resistances R33, R35, R36 and R34 are connected in series, is connected in parallel with the transistors Q31 and Q32, and a node between the resistances R33 and R35 is connected to a base of the transistor Q31, while a node between the resistances R36 and R34 is connected to a base of the transistor Q32. Further, a collector of the transistor Q31 is connected to a base of transistor Q33 (PNP-type), and similarly, a collector of the transistor Q32 is connected to a base of the transistor Q34 (NPN-type). A collector of the transistor Q33 and a collector of the transistor Q34 are connected, and an emitter of the transistor Q33 is connected to the power source +Vcc via a resistance R37, while an emitter of the transistor Q34 is connected to the power source −Vee via a resistance R38.

An input current Iin is supplied to a node between resistances R39 and R40, which are arranged in series between the respective emitters of the transistors Q31 and Q32. A node between the resistance R35 and R36 is connected to ground, and a node between a collector of the transistor Q33 and a collector of the transistor Q34 is an output point for output current Iout.

Figure 9:
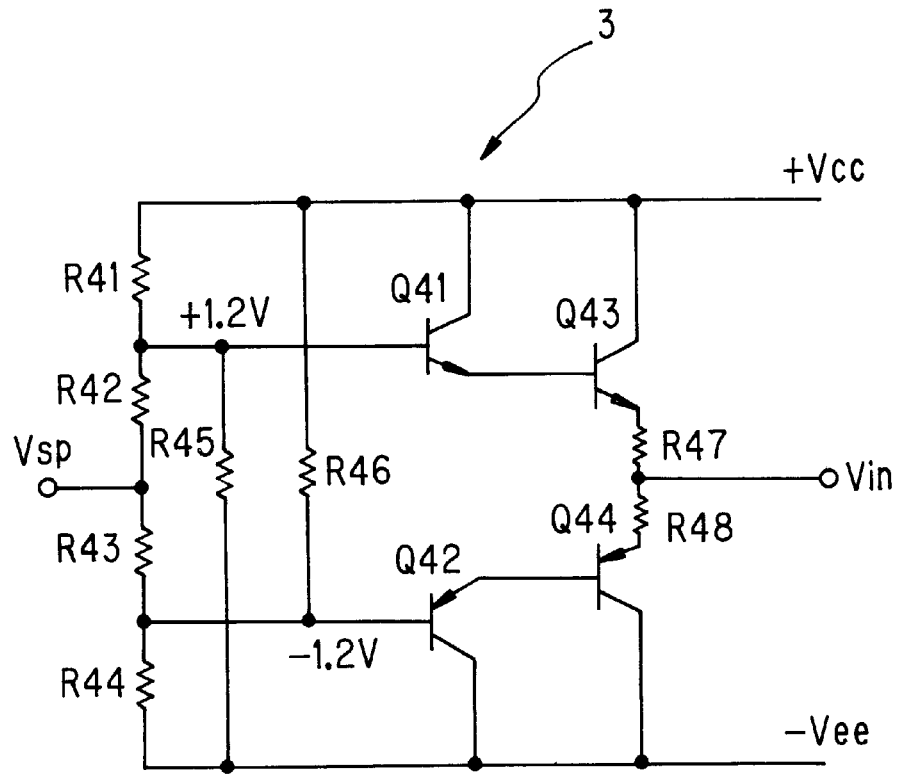
FIG. 9 is a circuit diagram showing a particular embodiment of a voltage amplifier for the output signal converter according to the invention.

FIG. 9 is a circuit diagram showing a concrete embodiment of the voltage amplifier 3. As shown in FIG. 9, the voltage amplifier 3 comprises four transistors Q41–Q44 and a plurality of resistances and is connected between the power sources +Vcc and −Vee. Between the power sources +Vcc and −Vee, a connecting circuit branch including resistances R41, R42, R43 and R44 connected in series is arranged. A node between the resistance R41 and the resistance R42 is connected to two branches. One of the branches is connected to a base of the transistor Q41 (NPN-type), while the other branch is connected to the power source −Vee via a resistance R45. Similarly, a node between the resistance R43 and the resistance R44 is connected to two branches. One of the branches is connected to a base of the transistor Q42 (PNP-type), while the other is connected to the power source +Vcc and includes a resistance R46.

Further, a collector of the transistor Q41 is connected to the power source −Vcc, and an emitter is connected to a base of the transistor Q43 (NPN-type). Similarly, a collector of the transistor Q42 is connected to the power source −Vee, and an emitter is connected to a base of the transistor Q44 (PNP-type). In addition, a collector of the transistor Q43 is connected to the power source +Vcc, a collector of the transistor Q44 is connected to the power source −Vee, and the respective emitters of the transistors Q43 and Q44 are connected via microresistances R47 and R48. Further, a node between the resistance R42 and the resistance R43 is provided as an input point for voltage, that is a terminal voltage Vsp of the speaker 4 shown in FIG. 7, and a node between the resistance R47 and the resistance R48 is provided as an output point for voltage, that is −Vin.

Now, performance of the output signal converting circuits shown in FIGS. 7–9 are described in detail. In the current amplifier 2 shown in FIG. 8, the two resistances R34 and R36 are arranged between the power source −Vee and GND, and therefore, a voltage applied to the base of the transistor Q32 comes to a value of $[R34/(R34+R36)]*(-Vee)$. Due to application of this voltage to the base of the transistor Q32, bias current Ib flows between the collector and the emitter of the transistor Q32, and input electric potential becomes almost 0 V and this voltage is maintained irrespective of the start of input current flow. When voltage drop in the diode D31 and voltage drop between the base and the emitter of the transistor Q34 is the same, the voltage applied to the resistances R32 and R38 are the same too, so that a current Ir32 flowing in the resistance R32 and a current Ir38 in the resistance R38 can be calculated according to the following equation:

$$Ir38=-Ir32*R32/R38.$$

Similarly, if Ir37=−Ir31*R31/R37, R31=R32, R37=R38, and k=R32/R38 are given, Ir38=−Ir32*k, and Ir37=−Ir31 *k are obtained. If input current Iin is replaced by il–iu, wherein iu is current in the direction to the resistance R39 and il is current in the direction to the resistance R40, the following relationships result:

$$Ir32=il+Ib,\ Ir31=iu+Ib$$

$$Iout=Ir37-Ir38=-k*Iin=-(R32/R38)*Iin$$

Then, an equation, $$I_{out} = -(R32/R38) * I_{in} \tag{8}$$

is obtained, and from which it will be understood that input current has been amplified.

Here, for an embodiment of the circuit shown in FIG. 8, the following exemplary parameters can be selected:

R31, R32=5Ω
P33, R34=150Ω
R35,R36=5Ω
R37, R38=2.5Ω
R39, R40=0.5Ω
+Vcc=+20 V
−Vee=−20 V

According to the parameters above, R32/R38=2, so that it is understandable that the current amplification factor is doubled. The resistances R39 and R40 and the two diodes D31 and D32 are used for stabilizing the performance of the circuit.

Now, an explanation of the performance of the voltage amplifier 3 shown in FIG. 9 is given. In this figure, an input voltage in voltage amplifier 3 is a voltage Vsp to be applied to the speaker 4 (see FIG. 7), and an output voltage is Vin. As shown in FIG. 9, a series connecting circuit containing the resistances R41 and R45 is connected between the positive power source +Vcc and negative power source −Vee so that a voltage at the node between the resistance R41 and R45 comes to a value that is determined by these resistances. Now, as concrete resistance values, the following examples are provided:

R41, R44=189Ω
R42, R43=100Ω
R45, R46=213Ω
+Vcc=+20 V
−Vee=−20 V

Then, a voltage at the node between the resistances R41 and R45 is +1.2 V, and this voltage is applied to the base of the transistor Q41. Further, taking into consideration the fact that the resulting parallel resistance of the resistances R41 and R45 is approximately 100Ω and the resistance R42 is 100Ω, an input signal Vsp is attenuated to a ½ value at the node of the resistances R41 and R45, that is the base of the transistor Q41. Since the transistors Q41 and Q43 each independently perform as an emitter follower, a signal applied to the base of transistor Q41 is output as an output voltage Vin. Namely, output voltage Vin becomes ½ of the input voltage Vsp, and it will be understood that the voltage amplification factor is ½. With regard to the circuit portion shown on the lower part of the drawing which includes the transistors Q42, Q44, etc., since this circuit portion differs from the one shown on the upper part only in polarity, and since it performs in the same manner as described above, no explanation of this latter circuit portion shall be made.

As described above, the current amplifier 2 can have a current amplification factor Ac of 2 and the voltage amplifier 3 can have a voltage amplification factor of ½, and since the power produced by an output signal converting circuit equipped with this current amplifier 2 and this voltage amplifier 3 can be either amplified or attenuated proportionally to the square of the current amplification factor Ac, the output power can be multiplied by four. Whereas, output power can be attenuated if the current amplification factor Ac is set to a value less than 1, and approaches zero. And, if the current amplifier 2 and the voltage amplifier 3 are connected with each other as shown in FIG. 7, the relationship Ac*Av=−1 is obtained so that the impedance of the load side viewed from the tube amplifier 5 equals the impedance for directly connecting the speaker 4 to the tube amplifier 5, while the impedance of the power side viewed from the speaker 4 equals the impedance for directly connecting the tube amplifier 5 to the speaker 4. Consequently, output properties obtained from the tube amplifier 5 are directly amplified by the output signal converter 7 and then supplied to the speaker 4, and therefore, it becomes possible to obtain output properties which are substantially the same as those obtained by using either high power or low power vacuum tubes.

As described above, in the output signal converter shown in FIG. 7, the output of the tube amplifier 5 containing a small number of vacuum tubes can be amplified by means of semiconductor devices therein, such as transistors, while maintaining the output properties obtained by using tube amplifiers. It is possible to obtain output properties which are substantially the same as those obtainable by using high power tube amplifiers. In this way, it becomes possible to construct a high power tube amplifier by using a minimum number of vacuum tubes which have the disadvantages that they have shorter longevity, produce more heat, require a higher voltage power supply, and are more costly. This type of amplifier will be extremely advantageous for use in electronic guitar and audio systems. In addition, there is a further advantage to the output signal converter according to the present invention because it can faithfully reproduce the output properties obtainable by using tube amplifiers instead of the output properties obtainable by using the conventional amplifiers comprising only semiconductor devices, which just imitate the output properties of the tube amplifiers.

In the output signal converter according to this embodiment, it is also possible to reduce the power of the tube amplifier 5. Now, the purpose of attenuation of the output signals as described above is explained. Taking the example of an electronic guitar, the output sound of the electronic guitar is often intentionally distorted in order to create a feeling of presence and dynamism during a live concert. Therefore, even during practice prior to the live concert, it is preferable to distort the output sound as well as during the live concert. However, the guitar sound must be produced at high sound volume in order to distort the output sound, but it is difficult to do so in a studio for practice because the noise generated is so troublesome to the neighbors. In such a case, since the output signal converter shown in FIG. 7 can attenuate the output produced by the tube amplifier 5 and can output the distorted sound at low volume, it is very useful to use the output signal converter in this situation.

Further, in the embodiment shown in FIG. 7, the same power circuit 6 is used as a power supply for driving the tube amplifier 5, for driving the current amplifier 2 and for the voltage amplifier 3, however, it is also possible to build the circuit with independent power supplies for each of these components. In this case, the properties of the tube amplifier can be either amplified or attenuated without causing changes in the properties including an effect of power voltage fluctuation accompanying load fluctuation of the tube amplifier.

Figure 10:
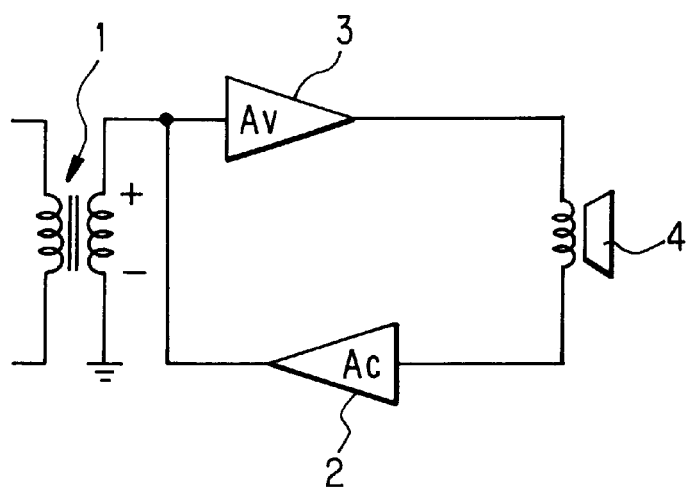
FIG. 10 is a circuit diagram showing a modification of the embodiment of the output signal converter for tube amplifiers shown in FIG. 7.

FIG. 10 shows a modification of the output signal converter shown in FIG. 7, wherein the speaker 4 is connected in series between an output terminal of the voltage amplifier 3 and an input terminal of the current amplifier 2. A node between an output terminal of the current amplifier 2 and an input terminal of the voltage amplifier 3 is connected to one terminal located at the secondary side of the output transformer 1. It is also possible to obtain the same performance as that obtainable by employing the output signal amplifying circuit shown in FIG. 7.

Figure 11:
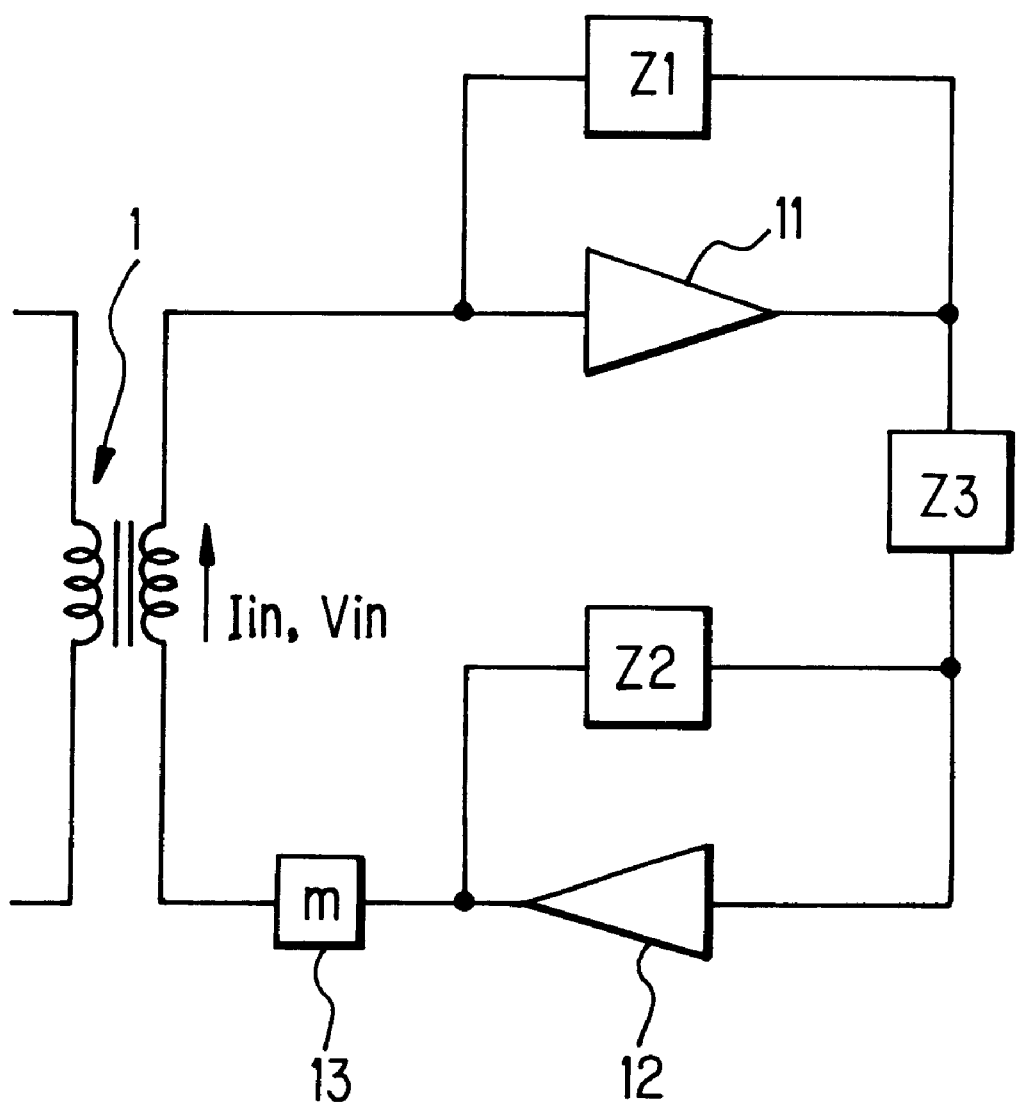
FIG. 11 is a circuit diagram showing the output signal converter for tube amplifiers according to a sixth embodiment of the present invention.

FIG. 11 is a circuit diagram showing the output signal converter according to a sixth embodiment of the present invention, and this output signal converter comprises first and second voltage amplifiers 11 and 12 having infinite amplification factor and a coefficient multiplier 13. The first voltage amplifier 11, a load Z3, the second voltage amplifier 12 and the m-times coefficient multiplier 13 are connected in series at the secondary side of the output transformer 1. A load Z1 is arranged in parallel to the first voltage amplifier 11, while a load Z2 is arranged in parallel to the second voltage amplifier 12. If an input current at the secondary side of the output transformer 1 is given as Iin and an input voltage is given as Vin, the following equation (9) can be given:

$$Iin*Z1*(Z2/Z3)*m+Vin=0 \qquad (9)$$

According to the equation described above, an input impedance Zin can be given from the following equation (10):

$$Zin=Vin/Iin=-m*Z1*(Z2/Z3) \qquad (10)$$

In order that Zin=Z2, a correlation,
m*(Z1/Z3)=−1 is necessarily required, and when the load Z2 is due to the speaker 4, the voltage Vsp at both terminals of the speaker 4 is given according to the following equation (11):

$$Vsp=Iin*Z1*Z2/Z3 \qquad (11)$$

Then, the amplification factor is given by Vsp/Vin, and the value obtained is equal to −1/m. If m =−0.316, Z1=1 and Z3=0.316 result. Since the output level is proportional to the square of 1/m, an equation, (1/0.316)*(1/0.316)=10 results, so that the output is multiplied by a factor of 10. Further, as described above, since Zin=Z2 and Z2 is the speaker 4, the input impedance Z2 at output signal converter and the impedance at the speaker 4 will be equal, and therefore, the output signals can be either amplified or attenuated while maintaining the output properties obtainable by using the tube amplifier 5 which is provided in front of the output transformer 1, similar to those according to the embodiment shown in FIG. 7.

While the invention has been particularly shown and described with reference to preferred embodiments thereof, it be understood by those skilled in the art that various changes in form and details may be made therein without departing from the spirit and scope of the invention.

What is claimed is:

1. An output signal converter comprising semiconductor devices for amplifying or attenuating an output signal of a tube amplifier while maintaining output properties of the tube amplifier, said output signal converter comprising an output transformer (1) connected to the tube amplifier and having two output terminals;

a circuit branch consisting of a current amplifier (2) and a voltage amplifier (3) serially connected with each other via a node, wherein said circuit branch is connected across the output terminals of the output transformer (1), said current amplifier (2) has a current amplification factor (Ac) and said voltage amplifier (3) has a voltage amplification factor (Av); and a speaker (4) including two input terminals, wherein one of the input terminals of the speaker is connected to the node between the current amplifier (2) and the voltage amplifier (3) while another of the input terminals of the speaker is connected to ground; and wherein the current amplification factor (Ac) of the current amplifier (2) and the voltage amplification factor (Av) of the voltage amplifier (3) are related according to the following equation: Ac*Av=−k, wherein k is a constant.

2. An output signal converter comprising semiconductor devices for amplifying or attenuating an output signal of a tube amplifier while maintaining output properties of the tube amplifier, said output signal converter comprising an output transformer (1) connected to the tube amplifier and having two output terminals;

a loop circuit in which a voltage amplifier (3), a speaker (4) and a current amplifier (2) are connected in series with each other and with a node between the voltage amplifier (3) and the current amplifier (2), wherein said node is connected to one of the output terminals of the output transformer (1), said current amplifier has a current amplification factor (Ac) and said voltage amplifier has a voltage amplification factor (Av); and wherein another of the output terminals of the output transformer (1) is connected to ground and the current amplification factor (Ac) of the current amplifier (2) and the voltage amplification factor (Av) of the voltage amplifier (3) are related by the following equation: Ac*Av=−k, wherein k is a constant.

3. An output signal converter comprising semiconductor devices for amplifying or attenuating an output signal of a tube amplifier to be supplied to a speaker while maintaining output properties of the tube amplifier, said output signal converter comprising an output transformer (1) connected to an output terminal of the tube amplifier and including two output terminals;

a first voltage amplifier (11) connected between said output terminals of the output transformer (1) and having an infinite amplification factor;

a first impedance circuit (Z3);

a second voltage amplifier (12) having an infinite amplification factor;

a series connecting circuit branch with a coefficient multiplier (13); and a second impedance circuit (Z1) connected in parallel across the first voltage amplifier (11); and wherein the speaker (Z2) is connected in parallel across the second voltage amplifier.

* * * * *